United States Patent
Dragone et al.

(10) Patent No.: US 8,631,058 B2
(45) Date of Patent: Jan. 14, 2014

(54) PROVIDING NONDETERMINISTIC DATA

(75) Inventors: Silvio Dragone, Zurich (CH); Tamas Visegrady, Zurich (CH); Vincenzo Condorelli, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 575 days.

(21) Appl. No.: 12/915,003

(22) Filed: Oct. 28, 2010

(65) Prior Publication Data

US 2011/0106870 A1 May 5, 2011

(30) Foreign Application Priority Data

Oct. 29, 2009 (EP) .................................... 09174509

(51) Int. Cl.
*G06F 7/58* (2006.01)

(52) U.S. Cl.
USPC .......................................................... 708/255

(58) Field of Classification Search
None
See application file for complete search history.

(56) References Cited

U.S. PATENT DOCUMENTS

| | | | | |
|---|---|---|---|---|
| 5,327,365 | A * | 7/1994 | Fujisaki et al. | 708/254 |
| 7,613,915 | B2 * | 11/2009 | Srinivasan et al. | 713/1 |
| 2010/0091988 | A1 * | 4/2010 | Srinivasan et al. | 380/46 |
| 2010/0332574 | A1 * | 12/2010 | Herbert et al. | 708/251 |

* cited by examiner

*Primary Examiner* — David H Malzahn
(74) *Attorney, Agent, or Firm* — Cantor Colburn LLP

(57) ABSTRACT

A system and method for providing non-deterministic data for processes executed by non-synchronized processor elements of a fault resilient system is discussed. The steps of the method comprise receiving a request for getting non-deterministic data from a requesting processor element; assigning non-deterministic data generated by an entropy source to the request; and supplying the non-deterministic data assigned to the request, to the requesting processor element.

19 Claims, 2 Drawing Sheets

PROVIDING NONDETERMINISTIC DATA

CROSS REFERENCES

This application claims priority from European application number EP 09174509.1 filed Oct. 29, 2009. That application is incorporated by reference herein.

BACKGROUND OF THE INVENTION

1. Field of the Invention

This invention relates to a method, apparatus and related program product for providing nondeterministic data and in particular to techniques for providing nondeterministic data executed by non synchronized processor elements of a fault resilient system using an assignment logic and at least one entropy source.

2. Description of Background

In many applications, especially safety relevant and fault resilient systems, a process or a program is executed by one or more processors or their elements to increase the safety and reliability of the overall system. For example, in a fly-by-wire system of an aircraft it is important that a calculated result for a control signal does not contain any errors. In such systems the results achieved can be compared with each other in an effort to reduce errors that can affect system reliability. If the results obtained are identical, it can then be assumed, with some degree of high probability, that the calculated result is correct and does not contain errors.

In such instances, several processor elements of the same type can undergo an externally enforced synchronization via a lockstep operation. To achieve this, the external operation conditions of all processor elements have to be identical (e.g. the processor elements get the same input data and receive the exactly same clock signal.) However, this kind of enforced synchronization is hard to implement because a circuit design for such a system is difficult and has many restrictions.

Accordingly, it is desired to make a deterministic embedded system fault resilient without explicit cross checking or externally enforced synchronization of multiple backend or processor elements by a lockstep operation. While prior art provides some insight into implementing state oriented channels which stores multiple responses and detects mismatches to avoid an externally enforced synchronization, it does not provide for processes executed by different non-synchronized processor elements with nondeterministic data. For example, cryptographic processors executed by non-synchronized processor elements may have to be supplied with non-deterministic data. In the previous example, in a fly by wire system of an aircraft several non-synchronized processor elements may send a request to a sensor to get sensor data, wherein these processor element requests are unsynchronized and will get time-dependent, nondeterministic results from the sensor. Another example that can be used is one that involves generating nondeterministic data for an entropy source that is a True Random Number Generator (TRNG).

Consequently, it is desirable to introduce a solution that can provide improved techniques to provide nondeterministic data that is executed by different non-synchronized process elements while minimizing any errors generated by the process.

SUMMARY OF THE INVENTION

The shortcomings of the prior art are overcome and additional advantages are provided through the provision of a system and related method for providing non-deterministic data for processes executed by non-synchronized processor elements of a fault resilient system. The steps of the method comprise receiving a request for getting non-deterministic data from a requesting processor element; assigning non-deterministic data generated by an entropy source to the request; and supplying the non-deterministic data assigned to the request, to the requesting processor element.

In one embodiment the assignment logic comprises at least one memory providing a request buffer for each request wherein said request buffer storage is storing temporarily nondeterministic data to be processed by the requesting processor element. Each request buffer can also have a read pointer to indicate the nondeterministic data that has already been processed by the requesting processor element. The assignment logic can also comprises an entropy extractor for extracting request variation data of provided requests and a mixer for mixing the extracted entropies of request variations In another embodiment, the assignment logic is provided for assignment of nondeterministic data generated by at least one entropy source to a request for getting nondeterministic data, wherein said request is received from a requesting processor element of a group of non synchronized processor elements within an embedded system. The embedded system can be formed by card pluggable into a host device or alternatively have periphery units comprising cryptographic co-processors connected to the assignment logic via an on-chip bus.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DESCRIPTION OF THE INVENTION

Figure 1:
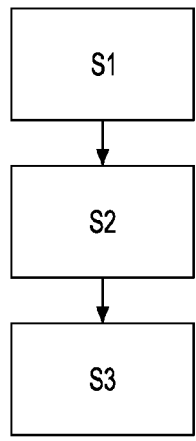
FIG. 1 is a flowchart illustration showing a method for providing a nondeterministic data according to one embodiment of the present invention.

FIG. 1 is a flow chart illustration of a method for providing nondeterministic data as per one embodiment of the present invention. In the example provided by FIG. 1, the nondeterministic data will be particularly discussed in conjunction with processes executed by non synchronized processor elements referenced generally as 2 of a fault resilient system 1. The fault resilient system 1 will be discussed later in conjunction with FIG. 2. FIG. 1, shows three process steps S1, S2 and S3. While, the process step flows are generally provided in FIG. 1, the details of each step can be viewed in more detail by referring to the embodiments provided in FIGS. 2 and 3 respectively and discussed together with FIG. 1 as appropriate.

Figure 2:
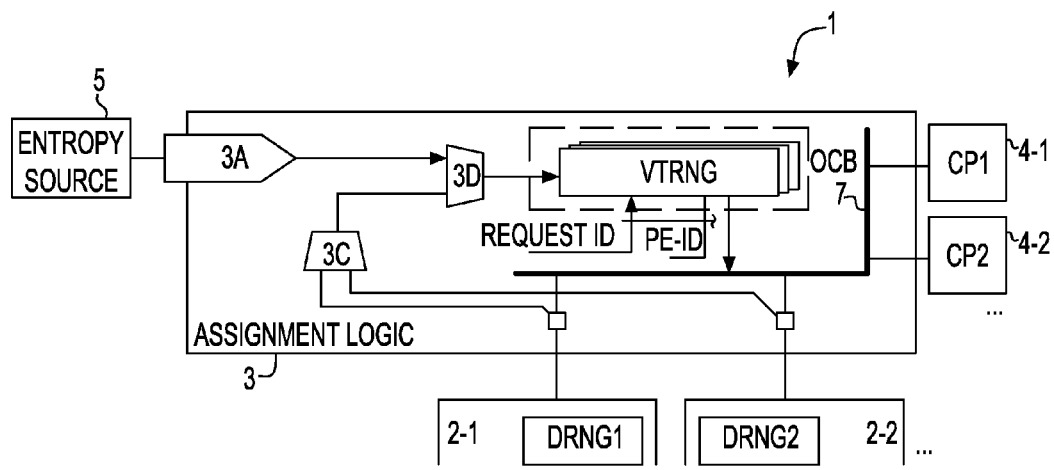
FIG. 2 is a block diagram illustration of one embodiment of the present invention showing a fault resilient system.

Referring back to FIG. 1, an overall discussion of the relationship between the three process steps will now be provided to ease understanding. In FIG. 1, process step S1 comprises the processing of a request for getting nondeterministic data as received from one or more requesting processor element(s). The processor element(s) are shown in more detail in FIG. 2 and are referenced by numeral 2-1 and 2-2. As can be appreciated by those skilled in the art, the process elements can vary in number. In FIG. 2, only two processor elements are shown as way of example with the understanding that in alternate embodiments, this number can be varied. To reflect such possible variations in the number of processor element(s), the processor element(s) will hereinafter referenced globally by numeral 2 (except for when the particular of elements 2-1 and 2-2 are being discussed in conjunction with FIG. 2).

In step S1 of FIG. 1, the request being processed can relate to a number of processes/commands as known to those skilled in the art. For example, the request can be one to get a Random Number (RN) for encrypting a message. Similarly, the processor element 2 can be comprised of a single processor pr be more complex. In one embodiment, one such processor element 2 can be a central processing unit CPU enabled for executing one or several processes of an application program. In a different embodiment, the processor element can be a commodity backend processor element of an embedded system such as a pluggable card or a host device. In one embodiment, the processor element 2 can be connected to one or more peripheral units such as co-processors (CP) or universal asynchronous receiver/transmitter (UARTs). In another embodiment, each processor element 2 can comprise a Deterministic Random Number Generator (DRNG) which can be connected and therefore driven in parallel.

In step S2 of FIG. 1, nondeterministic data can be generated by at least one entropy source. The entropy source can be viewed in more detail in FIG. 2 where it is referenced by numerals 5. This entropy source 5 can be assigned to the respective requester. In one embodiment this request can be made by an assignment logic (not illustrated) as known to those skilled in the art. In another embodiment, the entropy source 5 can be formed by a True Random Number Generator (TRNG), for example a hard wired random number generator. It should be noted that a True Random Number Generator (TRNG) is different from a pseudo random number generator in that the latter can only approximate the assumed behaviour of real hardware random number generator.

Figure 3:
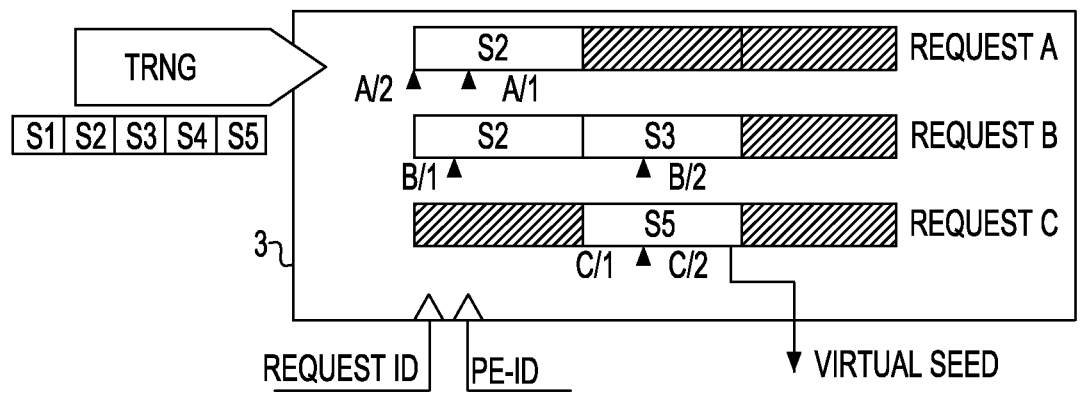
FIG. 3 is a block diagram illustrating functionality assignment logic according to one embodiment of the present invention.

Referring back to FIG. 1, in step S3 as shown in more detail in conjunction with FIG. 3, the nondeterministic data is supplied to the requestor of the requesting processor element. In one embodiment, this data is supplied via an on-chip data bus. In other embodiments, it is possible that the request variation data is extracted from the request received in step S1 and be provided by the processes executed by the non synchronized processor element(s) 2 directly.

In yet another embodiment, the extracted request timing variation data is then mixed to the nondeterministic data generated by the entropy source 5 and stored in request buffers. In another embodiment, the request buffers are provided within assignment logic 3. A possible source of entropy that can be extracted is jitter. Other sources of entropy can be sequences or type orders or other sources and sequences as known to those skilled in the art. One advantage of this is that the process of providing nondeterministic data is that according to one embodiment of the present invention the process can be performed in real time. Furthermore, the techniques utilized by the embodiments discussed can be used in parallel to drive independent deterministic random generators provided within different non synchronized processor element(s) 2. One such embodiment is shown in the example of FIG. 2 as will now be discussed in more detail.

FIG. 2 is an illustration of a fault resistant system 1 as per one embodiment of the present invention. In the diagram illustration of FIG. 2, the fault resilient system 1 comprises non synchronized processor elements 2-1 and 2-2 connected to assignment logic 3. In FIG. 2, two processors are selected by way of example. However, as mentioned earlier, the number of processor elements can vary from one to a number of elements denoted here for ease of understanding by 2-$i$. In one embodiment, the fault resilient system 1 comprises a plurality of different processor elements 2-$i$ wherein the processor elements 2-$i$ can be of the same or different type. The processor elements 2-$i$ can comprise in a possible embodiment each a deterministic Random Number Generator (DRNG) as shown in FIG. 2. In one embodiment, the processor elements 2-$i$ form a group of non synchronized processor elements within an embedded system. This embedded system can be formed by a number of ways such as by a pluggable card. The card can then be plugged into a host device.

In one embodiment, the embedded system comprises the processor element(s) 2 as well as periphery units such as cryptographic co-processors, in this example 4-1 and 4-2, that are connected to the assignment logic 3 by means of an on-chip bus (OCB 7). The assignment logic 3 is further connected to at least one entropy source 5 which generates nondeterministic data as shown in the figure.

In the embodiment of FIG. 2, the nondeterministic data once generated is then received at an input 3A and is then assigned by the assignment logic 3 to a requester responsible for obtaining nondeterministic data provided by the requesting processor element 2-$i$. The entropy source 5, in one embodiment, is a True Random Number Generator (TRNG) which generates Random Numbers (RN) as nondeterministic data.

A request for receiving nondeterministic data is generated, in one embodiment, by a process of an application program or thread executed by the respective processing element 2-$i$. The requests can comprise a request ID for identifying the request. This request ID is applied to the assignment logic 3 by the requesting processor element 2-$i$ executing the respective process which generates the request. The processor elements 2 each comprise a processor ID for identifying the respective processor element. This processor ID can be applied to the assignment logic 3 to indicate the requesting processor element 2-$i$.

In the embodiment shown in FIG. 2, the assignment logic 3 comprises at least one memory providing a request buffer for each received request. The respective request buffer temporarily stores the nondeterministic data that is to be processed by the requesting processor element 2-$i$. In addition, the assignment logic 3 further comprises an entropy extractor 3C for extracting request variation data of received requests such as provided by one or more processes and executed by the nonsynchronized processor elements 2-$i$. This entropy extractor 3C, in one embodiment can be a jitter extractor which observes timing differences between corresponding processor element operations on the on-chip bus (OCB 7). However, other extractors can also be utilized as known by those skilled in the art. The extractor 3C can capture aggregates of time variation. For example, the bus visible timing variation can be conveniently collected by the extractor 3C without the need of a corresponding application.

In one embodiment, the entropy extractor 3C is connected to a mixer 3D. The mixer 3D is provided for mixing the extracted entropies of request variations with the nondeterministic data generated by the entropy source 5 (received via the input 3A of the assignment logic 3). The mixed data generated by the mixer 3D is distributed to the request buffer storages of the memory 3B within the assignment logic 3. In one embodiment, the request buffers are formed by FIFO registers. In an alternate embodiment, the request buffers can also be formed by FILO memories or data stacks.

The on-chip data bus (OCB 7) is provided for supplying the nondeterministic data assigned to a request by the assignment logic 3 to the processor element 2-$i$ executing the process which has applied the respective request to the assignment logic 3. The nondeterministic data can form in a possible embodiment data for a Deterministic Random Number Generator (DRNG) within the respective processor elements 2-$i$. In yet another embodiment, the processor elements 2-$i$ can execute the same requests without external coordination or synchronization.

In one embodiment, a host channel or a communication channel such as a DMA-channel submits every request of a host device such as a server to all processor elements 2-$i$. Such a main host-request of a host device can trigger the execution of processes by the different processor elements 2-$i$ wherein each process running in a processor element 2-$i$ can generate in turn one or several process requests to get deterministic data. It is not necessary that the host device is aware of the parallel backend execution by the different physical processor elements but may see only one logical processing element. The host device can maintain a state for each request. Multiple processing elements 2-$i$ executing the calculations in an arbitrary order can be matched within the channel. Accordingly, the channel can derive secondary timing information from the processor elements 2-$i$ without that an external control by the host device is necessary. In another embodiment, the channel can maintain a per request table of result checksums.

In yet another embodiment, when returning a response, the channel can compare any previously seen checksums to that of the currently processed response. The case of a mismatch a failure can be indicated to the host device. Since the respective channel controls and instantiates all external interfaces of the processing elements any data traffic around periphery units such as co-processors 4-$i$ is also visible to the respective channel. In conjunction with the embodiments discussed, the system as per one embodiment of the present invention can utilize the request matching infrastructure of a channel to extract entropy from a system state. As can be seen from FIG. 2 the visible nondeterministic information data can be mixed into the TRNG data stream received from the entropy source 5.

FIG. 3 is an illustration of an exemplary embodiment showing an assignment logic 3. In this example, the assignment logic 3 receives seed blocks $S_I$ as nondeterministic data from a True Random Number Generator (TRNG) and assigns this nondeterministic data to request buffers of three different requests A, B, C as shown in FIG. 3. Each request A, B, C is identified by a corresponding request ID received by the assignment logic 3.

In one embodiment, the request buffers for different requests are shown as A, B, C and are formed by FIFO registers or LIFO registers which can have the same or different storage capacities. In this example, the TRNG has provided seed blocks S1 to S5 assigned to the requests, A, B, C in FIFO order. In the shown example there are three outstanding seed requests A, B, C and two processing elements 2-1, 2-2 executing processes which have generated the requests. Accordingly each per request buffer shown in FIG. 3 maintains two usage or read positions, i.e. one pointer read position per processor element 2.

In one embodiment, the pointer can be formed by a counter which indicates how far the respective request processing has fetched the nondeterministic seeds S1 to S5. In the example of FIG. 3 the execution of the request A by the two different processes has slightly diverged but both processes are still processing the same seed block S1. The subsequent seed requests from processor element 2-2 are served by seed bytes already processed by the processing element 2-1 as shown by the relative positions of the A/1 and A/2 pointers in FIG. 3.

In the example discussed in conjunction with FIG. 3, the execution of the processes by the different processing elements 2-1, 2-2 is more diverged for request B. In the shown example the process instance executed by processing element 2-2 has so far advanced as indicated by pointer B-2 that it already processes seed block S3 whereas the process instance executed by processing element 2-1 executing the same request B is lagging as indicated by read pointer B/1. The request C will process sufficient seed data to request seed blocks S4 and S5. Coincidentally process instances C/1 and C/2 will fetched the same amount of random seeds or nondeterministic data. Both processes can advance beyond seed block S4 by only needing to maintain seed block S5 (as used).

As can be seen from the illustration of FIG. 3, in this example, the storage scheme as employed by the fault resilient system 1 is straight forward and scalable. Both VTRNG instances maintain separated TRNG seed blocks and index them per request and per processing element basis. The fault resilient system 1 comprises a finite number of processing elements 2-$i$ and a limited number of outstanding requests. Accordingly the maintenance of VTRNG instances requires a limited storage in the fault resilient system 1. In a process a request for nondeterministic data is performed in that the process executed by the processing element 2 calls for nondeterministic data such as a seed block by supplying a request ID to the assignment logic 3.

In one embodiment, the channel can append a processor element identifier PE-ID transparently without the processing element 2 observing the addition of the identifier. As the process element identifier PE-ID is appended by the channel, from the perspective of the processor element 2 or application only the request ID is passed as input to the service requesting nondeterministic data. In a possible embodiment the assignment logic 3 rejects the request if the request ID processor element-ID combination applied to the assignment logic 3 is not registered in a list or a configuration memory. The request for nondeterministic data can be a request for seed blocks. If there is insufficient seeding in the currently active seed block the assignment logic 3 can fetch a new TRNG data block or data blocks and deposit them into the VTRNG instance of the respective request. Subsequently, a read pointer of the request ID/processor element pair is advanced or incremented and the seed data is returned from the VTRNG instance. In a possible embodiment the requested seed block can be marked as unused or no longer used if all processing elements 2-$i$ have moved beyond the seed block for the given request ID.

In the example shown in FIG. 3 since the seed block S4 has been used before seed block S5 it can be flagged as inactive in both read pointers C/1 and C/2 because request C has advanced to seed block S5. In the shown embodiment the seed blocks or nondeterministic data are fetched on demand. All valid request ID/processor element pairs can freely request nondeterministic data or seed blocks and get properly assigned seed blocks for arbitrary sequences of seed requests. The fault resilient system 1, in these embodiments, employs request IDs of sufficient size to separate applications executed within different processor elements 2. In a system, with non trusted or non cooperative backend or processor elements the channel generates request IDs which are infeasible to derive during typical request processing latencies.

In one embodiment, the entropy is extracted from timing variations visible between the channel and the processor element interfaces. By providing only a limited amount of entropy these measurements are readily available for the channel even without the cooperating processor element application or even when processor elements execute unknown code. In the systems where more detailed performance monitoring is available or processor elements internal diagnostics supply more entropy sources the system can be extended to incorporate them into the entropy extraction. Since the VTRNG instances are fed from the same TRNG entropy source 5 they can interact and block each other. In the system 1 nondeterministic data services can be transparently virtualized on the basics of nondeterministic data provided by a real entropy source. A channel can be extended into a fault tolerant channel device on the basis of data provided by a centralized random number generator to allow uncoordinated results to produce the same random results while utilizing a True Random Number Generator (TRNG). The system 1, of the shown figures as discussed, allows to transparently transform independent, commodity processor elements behind an intelligent channel into a single fault resilient channel device.

The embodiments as discussed in conjunction with FIGS. 1 through 3 and as discussed in detail above may be combined with one or several of the other embodiments shown and/or described to achieve a variety of results as can be appreciated by one skilled in the art. It is also possible for one or more features of the embodiments to be combined and or used independently as desired by one or more particular applications. For example these described techniques may be implemented as a method, apparatus or article of manufacture involving software, firmware, micro-code, hardware and/or any combination thereof. The term "article of manufacture" as used herein refers to code or logic implemented in a medium, where such medium may comprise hardware logic [e.g., an integrated circuit chip, Programmable Gate Array (PGA), Application Specific Integrated Circuit (ASIC), etc.] or a computer readable medium, such as magnetic storage medium (e.g., hard disk drives, floppy disks, tape, etc.), optical storage (CD-ROMs, optical disks, etc.), volatile and non-volatile memory devices [e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.].

In addition, as can be appreciated by those skilled in the art, certain modifications may also be made to the embodiments of the present invention without departing from the scope. For example, an article of manufacture made under the embodiments of the present invention may comprise any information bearing medium. In another embodiment, an article of manufacture can be comprised of a storage medium having stored therein instructions that when executed by a machine results in operations being performed.

In addition, in alternate embodiments of the present invention the techniques discussed can be used in an entirely hardware environment, an entirely software environment or an environment that includes both hardware and software elements and therefore used accordingly. In a preferred embodiment, the invention is implemented in software, which includes but is not limited to firmware, resident software, microcode and other similar components.

In other embodiments, the teachings of the present invention as discussed can be used in form of a computer program product accessible from a computer usable or computer readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

Computer program means or computer program in the present context can mean any expression, in any language, code or notation, of a set of instructions intended to cause a system having an information processing capability to perform a particular function either directly or after either or both of the following a) conversion to another language, code or notation; b) reproduction in a different material form.

In one embodiment, the code in the computer readable medium is accessed and executed by a processor. The medium in which the code or logic is encoded may also comprise transmission signals propagating through space or a transmission media, such as an optical fiber, copper wire, etc. The transmission signal in which the code or logic is encoded may further comprise a wireless signal, satellite transmission, radio waves, infrared signals, Bluetooth, etc. The transmission signal in which the code or logic is encoded is capable of being transmitted by a transmitting station and received by a receiving station, where the code or logic encoded in the transmission signal may be decoded and stored in hardware or a computer readable medium at the receiving and transmitting stations or devices. Additionally, the "article of manufacture" may comprise a combination of hardware and software components in which the code is embodied, processed, and executed.

It should be noted that any reference made to one or more embodiments does not include all embodiments of the present invention and is specific to a particular embodiment(s) as discussed. The terms "including", "comprising", "having" and variations thereof mean "including but not limited to", unless expressly specified otherwise. The enumerated listing of items does not imply that any or all of the items are mutually exclusive, unless expressly specified otherwise. The terms "a", "an" and "the" mean "one or more", unless expressly specified otherwise.

Additionally, when references are made as to one or more devices, any such devices that are in communication with each other need not be in continuous communication with each other, unless expressly specified otherwise. Devices that are in communication with each other may communicate directly or indirectly through one or more intermediaries. Additionally, a description of an embodiment with several components in communication with each other does not imply that all such components are required. On the contrary a variety of optional components are described to illustrate the wide variety of possible embodiments. Furthermore, when a single device or article is described herein, it will be apparent that more than one device/article (whether or not they cooperate) may be used in place of a single device/article. Similarly, where more than one device or article is described herein (whether or not they cooperate), it will be apparent that a single device/article may be used in place of the more than one device or article. The functionality and/or the features of a device may be alternatively embodied by one or more other devices which are not explicitly described as having such functionality/features. Thus, other embodiments need not include the device itself.

Furthermore, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously, in parallel, or concurrently.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A fault resilient system comprising:
   a plurality of non-synchronized processor elements for requesting non-deterministic data; said processor elements operable to execute one or more processes;
   an assignment logic for assignment of non-deterministic data generated using at least one entropy source in response to a request for getting the non-deterministic data received from a requesting processor element, wherein said assignment logic comprises an entropy extractor operable to extract request variation data from any received request provided by processes executed by said non-synchronized processor elements.

2. The fault resilient system according to claim 1, wherein said entropy source is a true random number generator (TRNG) operable to generate random numbers and the non-deterministic data is generated using the random numbers.

3. The fault resilient system according to claim 1, wherein said entropy source is a sensor operable to provide time dependent sensor data in response to the request, and the non-deterministic data is generated using the time dependent sensor data.

4. The fault resilient system according to claim 1, wherein each processor element comprises a processor-ID for identifying said processor element and said assignment logic is operable to use said processor-ID to determine said requesting processing element.

5. The fault resilient system according to claim 1, wherein each request comprises a request-ID for identifying requests from one another; and said requesting processor element is operable to provide said request-ID to said assignment logic during execution of respective processes to generate said request.

6. The fault resilient system according to claim 1, wherein said processor elements are uncoordinated backend processor elements, said entropy source includes nondeterministic timing of said uncoordinated commodity backend processor elements, and said assignment logic is configured to capture said nondeterministic timing of said uncoordinated commodity backend processor elements.

7. The fault resilient system according to claim 6, comprising a communication channel and a Virtualized True Random Number Generator (VTRNG), said VTRNG usable to provide fault resiliency on a plurality of non coordinated, independent commodity backend processor elements.

8. The fault resilient system according to claim 1, wherein said assignment logic further comprises at least a memory with buffers, said assignment logic operable to provide request buffer storage for each received request; said request buffer storage operable to store non-deterministic data at least temporarily so as to be processed by said requesting processor element(s) subsequently.

9. The fault resilient system according to claim 1, wherein said assignment logic comprises a mixer operable to mix extracted entropies of request variations of any nondeterministic data generated by said entropy source, said assignment logic is configured to provide request buffer storage for each received request, and wherein said request buffer storage(s) is distributed.

10. The fault resilient system according to claim 1, wherein each processor element comprises a deterministic random number generator (DRNG); said DRNG operable to receive random numbers from a request buffer storage within said assignment logic, said random numbers usable as seed data.

11. The fault resilient system according to claim 1, further comprising a data bus operable to supply the non-deterministic data assigned to a request by said assignment logic to said processor element(s).

12. The fault resilient system according to claim 1, wherein said assignment logic is operable to provide request buffer storage for each received request, wherein for each request buffer storage a read pointer is provided for each requesting processor element, said read pointer operable to indicate said non-deterministic data already processed by said requesting processor element.

13. A fault resilient computer system having at least one processor, said system comprising: an assignment logic for an assignment of non-deterministic data generated using at least one entropy source in response to a request for getting non-deterministic data, said assignment logic operable to receive said request from a requesting processor element of a group of non-synchronized processor elements within an embedded system,
   wherein said assignment logic comprises a mixer operable to mix extracted entropies of request variations of any nondeterministic data generated by said entropy source, said assignment logic is configured to provide request buffer storage for each received request.

14. The system of claim 13, wherein said embedded system is a card pluggable into a host device.

15. The system of claim 13, wherein said embedded system has periphery units comprising cryptographic coprocessors connected to said assignment logic via an on chip bus.

16. The system of claim 13, wherein the group of non-synchronized processor elements further comprises processor elements of the same or different processor types.

17. A method for providing non-deterministic data for processes executed by non-synchronized processor elements of a fault resilient system, said method comprising the steps of:
   (a) receiving a request for getting non-deterministic data from a requesting processor element;
   (b) assigning non-deterministic data generated by an entropy source to said request, said assigning including extracting request variation data from said request provided by processes executed by said non-synchronized processor elements; and
   (c) supplying said non-deterministic data assigned to the request to the requesting processor element.

18. The method according to claim 17, wherein said assigning includes using assignment logic to assign the nondeterministic data.

19. The method according to claim 18, wherein step (b) includes generating extracted request timing variation data from requests provided by said executed processes, and mixing the extracted request timing variation data generated by said entropy source.

* * * * *